United States Patent
Rheinfelder

[11] 3,983,486
[45] Sept. 28, 1976

[54] MODULAR CATV SYSTEM
[75] Inventor: William A. Rheinfelder, Phoenix, Ariz.
[73] Assignee: Alpha Engineering Corporation, Phoenix, Ariz.
[22] Filed: Nov. 29, 1974
[21] Appl. No.: 528,459

[52] U.S. Cl............................ 325/308; 178/DIG. 13; 330/148
[51] Int. Cl.² ............................................. H04N 7/10
[58] Field of Search.............. 178/DIG. 13; 325/308; 330/148

[56] References Cited
UNITED STATES PATENTS
3,386,568  6/1968  Harmon ................................ 206/47
3,535,640  10/1970  Forrest ................................ 325/308

Primary Examiner—Howard W. Britton
Attorney, Agent, or Firm—Cahill, Sutton & Thomas

[57] ABSTRACT

A CATV system is described wherein distribution cables are provided with amplifying means spaced at uniform intervals therealong. The amplifiers are provided with an input tap and two output taps, the first of which provides the usual gain to provide an output level equal to the input level plus the attenuation suffered by the signal traversing the cable from the preceding amplifier. The second output is provided by each amplifier by tapping the output signal at the first output tap with a directional coupler and processing the signal through an equalizer and coupling the output of the equalizer through a second directional coupler to a second output terminal. The signal derived at the second output terminal is such that a second identical amplifier connected to it will produce in its first output the signal levels required in the feeder system, when the first amplifier is operated at the signal levels appropriate for the main trunk system. Typically, the second output terminal is at a level equal to the input level for that signal plus one-half of the attenuation suffered by that signal traversing the cable from the preceding amplifier; for this case, the signal at the second output is chosen at a level that would otherwise occur at one-half of the normal amplifier spacing along the cable. The output level available at the second output is also applied through a directional coupler to a 4-way splitter, the output of which is connected to four house taps also provided on each amplifier.

17 Claims, 4 Drawing Figures

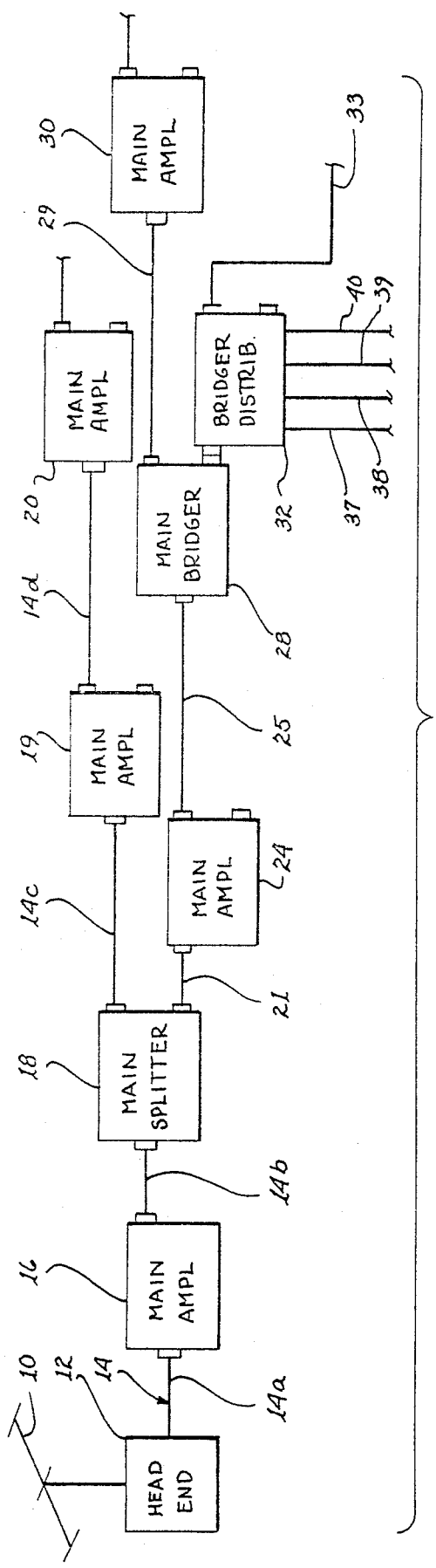
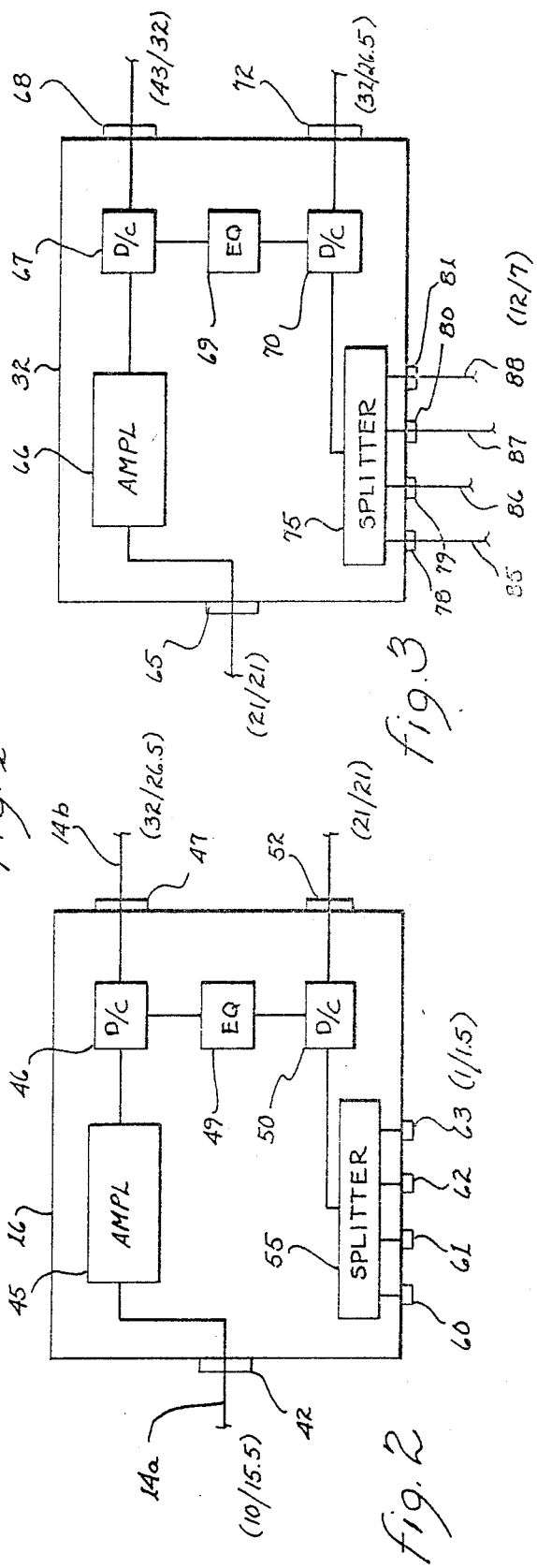
fig. 1
fig. 2
fig. 3

MODULAR CATV SYSTEM

The present invention pertains to cable television systems, and more particularly, to a modular CATV system.

The history of cable television has been one of generally haphazard growth wherein the specific problems encountered in a particular geographical area were solved in a unique fashion to essentially arrive at a "customized" or "tailor made" CATV system. Typically, existing CATV systems have been developed in this generally uncontrolled atmosphere and usually incorporate a great variety of equipment.

A CATV system will include so called "Head End" equipment including antennas, amplifiers, preamplifiers, modulators, etc. The antenna is usually geographically strategically located to intercept a television signal of suitable strength for use in the CATV system. This "Head End" equipment will, therefore, intercept an appropriate television signal and provide output signals appropriate for transmission on suitable transmission lines. The delivery of the intercepted and processed signal to the user's television sets is typically referred to as the CATV Distribution System. The system includes a main trunk that travels from the "Head End" equipment and is provided with a suitable number of repeater amplifiers spaced at predetermined lengths along the trunk. This main trunk may be divided into supplemental main trunks through the utilization of splitters which effectively "split" the signal and provide independent signals to two or more trunk lines. As the trunk line passes through the vicinity of subscribers, the signal is taken from the main trunk to feeder lines through the utilization of circuits known as bridger amplifiers; the feeder lines extend to the immediate area of the subscriber's homes and may extend substantial distances through the utilization of extender amplifiers. Directional taps or couplers are provided on these feeder lines to permit the connection thereto of several individual cables each to be connected to receivers in a subscriber's house. These cables traveling from the directional taps or couplers are referred to as house drop cables.

It can be seen from the above general description of the presently existing typical CATV system that a great variety of circuits are employed in the distribution system to transport the signal and direct same to the user's television set. It can be shown that there presently are in existence an excess of twenty different types of amplifiers such as main trunk repeaters, line extenders, bridger amplifiers and the like, that are being used in present CATV Distribution Systems.

It is, therefore, an object of the present invention to provide a CATV Distribution System with such signal levels and amplifications for both main trunk and feeder lines that it is possible to achieve the applicable amplification requirements of incorporating universal amplifiers singly or in combination thereof.

It is further an object of the present invention to provide a CATV distribution amplifier that permits modularity in a CATV distribution system.

It is also an object of the present invention to provide a CATV Distribution System incorporating universal amplifiers that may be utilized to replace substantially all of the variety of amplifiers presently used in such distribution systems.

It is still another object of the present invention to provide a CATV system incorporating a universal amplifier which may be constructed at substantial savings over the distribution systems and equipment presently in use.

It is still another object of the present invention to provide a CATV Distribution System incorporating universal amplifiers wherein the signal derived from the "Head End" equipment may be processed for use in subscriber television sets at a lower cost without sacrificing the quality of reception.

These and other advantages of the present invention will become more apparent as the description thereof proceeds.

The spacing of amplifiers on CATV Distribution System cables is usually stated in terms of the loss or attenuation experienced by the highest frequency signal being transmitted on the cable. That is, the coaxial cable typically used as a transmission line in such distribution systems has an attenuation characteristic that varies with or is a function of frequency. This variation is an exponential function and appears as a straight line on log-log paper. The frequencies involved in such transmission typically range from a low of 50 megahertz to 220 megahertz (representing the range of frequencies from channel 2 to channel 13). Therefore, it is common to express the spacing between amplifiers on a main trunk, for example, as "25 dB spacing" or "22 dB spacing" and the like. When spacing is given in such dB values, such values refer to the attenuation of the highest frequency being transmitted on the cable (channel 13).

With the distribution system having for example a 22dB spacing, it is apparent that a repeater amplifier will have to provide amplification for the highest frequency to provide an output signal having a level equal to the input signal at that frequency plus 22 dB. It can be shown that for a typical distribution cable with a 22 dB loss at the higher frequency (channel 13) the loss at the lower frequency (channel 2) is close to 11 dB. Therefore, such amplifiers provide a gain ranging from a high at the channel 13 frequency to a low at the channel 2 frequency for each of the frequencies or channels being amplified, the amplification is such that the output level exceeds the input level by an amount equal to the dB attenuation experienced by the signal while traversing the cable from the preceding amplifier.

It can be shown that a 3 dBmV level (that is, 3 dB above a 1 millivolt level) provides about equal safety margins from interference by the noise generated in a TV set or objectionable distortion effects. Utilizing this 3 dBmV level it can be shown that the optimum distribution level is 43 dBmV or 40 dB above the subscriber level. That is, the desirable level derived from the requirement of a 3 dBmV level at the subscriber can be shown to be 43 dBmV at the output of a feeder amplifier at channel 13.

A term frequently used in describing signal level of the signals of different frequencies is "tilt". That is, when the level of the highest frequency and the level of the lowest frequency has been raised to a point to compensate for the attenuation experienced by each of the frequencies during its transmission from the preceding amplifier the system tilt is referred to as "full tilt". When the signals have been attenuated, to the point that the level of the highest frequency and the level of the lowest frequency is the same, the signal may be said to be "flat". Normally system tilt refers to the tilt of signal levels at the output of an amplifier. A full tilt system is one that includes amplifiers that will accept flat inputs and produce full tilt outputs; similarly, a half tilt system is one wherein the signal levels are raised to a point that compensates for only half of the attenuation experienced by the signals of the different frequencies while traversing the distribution cables from the preceding amplifer. It can be shown that together with the optimum high frequency feeder level of 43 dBmV, the optimum tilt to be utilized in the feeder system is a full tilt. For a further discussion of the above technical details as well as a mathematical treatment of the various problems encountered with CATV Distribution Systems, reference may be had to *CATV System Engineering*, Third Edition, 1970 Tab Books, authored by the present inventor.

The present invention may more readily be described by reference to the accompanying drawings in which:

FIG. 1 is a block diagram of a CATV distribution system incorporating the teachings of the present invention.

FIG. 2 is a block diagram, in greater detail, showing a portion of FIG. 1.

FIG. 3 is a block diagram, somewhat enlarged and in greater detail, of a portion of FIG. 1.

Figure 4:
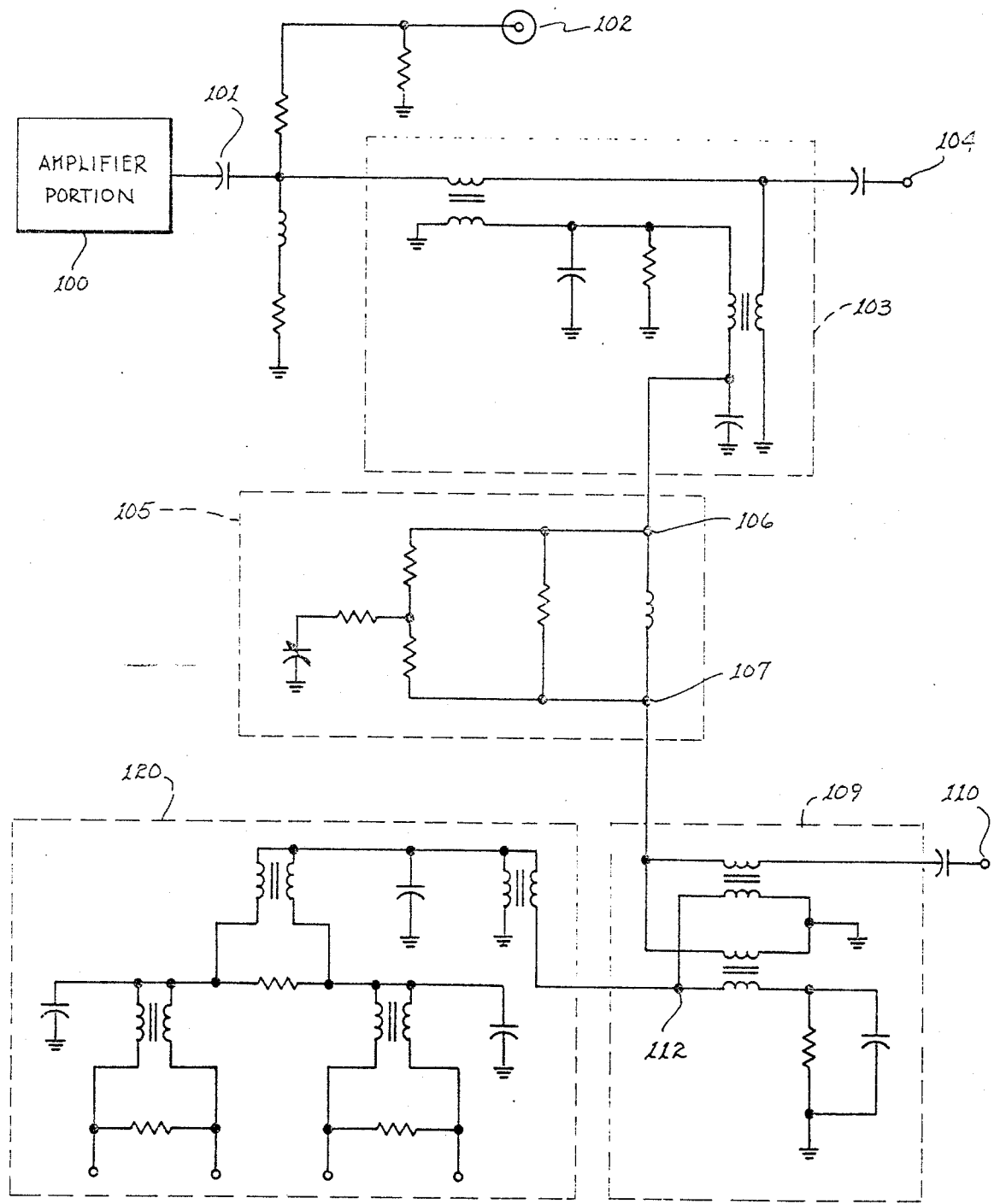
FIG. 4 is a schematic circuit diagram of portions of FIGS. 2 and 3.

Referring now to FIG. 1, a CATV distribution system is shown wherein a television signal is detected by an antenna 10 and appropriately processed by the "Head End" equipment 12. The signal derived from the "Head End" equipment 12 is applied to a main trunk cable 14 which transmits a signal to the geographical vicinity of the end users or subscribers. In the system of the present invention, amplifiers are spaced along the cable 14 at intervals of 22 dB; that is, each of the sections 14a, 14b, 14c, and 14d of the transmission cable 14 are 22 dB in length. Amplifiers 16, 18, 19 and 20 appropriately increase the levels of the respective frequencies being transmitted.

Amplifier 18, in addition to being a main amplifier or a main trunk amplifier, also acts as a splitter which receives a single input signal and provides two unequal output signals for application through two transmission cables. The input cable 14b to the amplifier 18 provides appropriate input signals to the amplifier which provides a full tilt output to the cable 14c; however, the second output of the amplifier 18 provides a flat output to the transmission cable 21. The cable 21 is, however, only 11dB in length rather than the standard 22 dB. The purpose for the difference in the outputs between the main or first output and the second output used in the splitter configuration will become apparent as the description thereof proceeds.

The cable 21 is applied to the input of amplifier 24 which acts as the main amplifier in a manner similar to amplifiers 16, 19 and 20. The first output of the main amplifier 24 is applied to transmission cable 25 which is of a standard 22 dB length. The cable 25 is applied to the input of amplifier 28 the first output of which is connected to the cable 29. The cable 29 is a standard 22 dB length and is connected to the input of the amplifier 30.

The amplifier 28 acts as a main amplifier and also as a bridger amplifier in combination with the amplifier 32. The second output of the amplifier 28 is coupled to the input of the amplifier 32; the first output of the amplifier 32 may be connected to a cable such as that at 33 for transmission of the signal to the vicinity of users or subscribers. The cable 33 becomes a feeder cable wherein the dB level of the signals are increased to a 43 dB level for channel 13 as described above. The amplifier 32 may also be used as a distribution amplifier with four house drop cables 37, 38, 39 and 40 connected thereto and each delivering a signal of an appropriate level to the individual subscriber television sets.

In the system of the present invention, the main amplifiers (such as 16, 19 and 20) as well as the amplifiers that are utilized as splitter amplifiers (such as amplifier 18) and also used as bridger amplifiers or bridger and distribution ammplifiers (such as amplifiers 28 and 32) are all of the same universal construction as will be described.

Referring now to FIG. 2, the universal amplifier of the present invention is shown with the signal levels indicated in parentheses at the input and the output thereof as they would appear when the amplifier is used on a main trunk. The input 42 is connected to the main trunk cable 14a at which point the signal levels would be as indicated (the first number representing the dBmV level of channel 13 while the second number represents the dBmV of channel 2). The signals are applied to an amplifier portion 45 which appropriately amplifies the input signal for application through a directional coupler 46 to the output terminal 47. It may be noted that the signal level of channel 13 has been raised 22 dB while the signal level of channel 2 has been raised 11 dB. It will be recalled from previous discussion that the amplification in this manner compensates for the attenuation of the respective frequencies during the travel of the signal from the previous amplifier. The directional coupler 46 is also connected to an equalizer 49, the output of which is connected through a second directional coupler 50. The directional coupler 50 is connected to the second output terminal 52; it may be seen that the signal levels present at the second output 52 are 21 dBmV for both channel 13 and 2. It will be recalled that such levels may be referred to as "flat" since the level of all frequencies is the same. The output of the directional coupler 50 is also applied to a 4-way splitter 55 which "splits" the signal applied thereto and provides four house taps, 60, 61, 62 and 63 with signals of appropriate levels for connection to house drop cables. When the amplifier as shown in FIG. 2 is utilized as a main trunk amplifier, only the input terminal 42 and the first output terminal 47 are utilized. In this particular application, the signal levels for channels 13 and 2 (at dB levels of 10 and 15.5 respectively) are amplified and presented to the output terminal 47 with increased levels of 22 dB at channel 13 to an increase of 11 dB at channel 2.

The same amplifier configuration may be utilized as a splitter, as a bridger, or as a distribution amplifier. For example, referring now to FIG. 3, the amplifier 32 is shown wherein it may be seen that the components of the amplifier 32 are identical to the components of the amplifier 16. Referring to FIG. 3, the input terminal 65 is connected through an amplifier portion 66 and through a directional coupler 67 to the first output terminal 68. The directional coupler is also connected through an equalizer 69 and a second directional coupler 70 to a second output terminal 72. The directional coupler 70 is also connected to a splitter 75 which splits the signal from the directional coupler to house taps 78, 79, 80 and 81. The construction of the universal 1. In a CATV system having cables with amplifying means spaced along said cables at predetermined unit intervals, or fractions thereof, to compensate for the attenuation of the signals being carried by said cables, the improvement comprising:
   a. amplifying means for receiving said signals as input signals and having a first and a second output terminal;
   b. said amplifying means including means for amplifying said input signals to a first level equal to the input signal levels plus the attenuation of said signals incurred by said signals while traveling said unit interval;
   c. means connecting signals amplified to said first level to said first output terminal;
   d. said amplifying means also including means for amplifying said input signals to a second level equal to the input signal levels plus a fraction of the attenuation of said signals incurred by said signals while traveling said unit interval;
   e. means connecting signals amplified to said second level to said second output terminal.

2. The improvement defined in claim 1 wherein said means for amplifying said input signals to a first level comprises: a coupling circuit, connected to said first output terminal an amplifier having a tilted output; and means connecting said tilted output to said coupling circuit.

3. The improvement defined in claim 1 wherein said means for amplifying said input signals to a first level comprises: a directional coupler, connected to said first output terminal; an amplifier having a tilted output; and means connecting said tilted output to said directional coupler.

4. The improvement set forth in claim 1 wherein said fraction of the attenuation is one-half of the attenuation.

5. The improvement set forth in claim 4 wherein said means for amplifying said input signals to a first level comprises: a coupling circuit, connected to said first output terminal; an amplifier having a tilted output; and means connecting said tilted output to said coupling circuit.

6. The improvement set forth in claim 4 wherein said means for amplifying said input signals to a first level comprises: a directional coupler, connected to said first output terminal and amplifier having a tilted output; and means connecting said tilted output to said directional coupler.

7. The improvement set forth in claim 6 wherein said means for amplifying said input signals to a second level comprises: an equalizer connected to said directional coupler for imposing a predetermined loss on signals from said directional coupler, said predetermined loss being greater for higher frequencies than for lower frequencies.

8. The improvement set forth in claim 7 including a second directional coupler connected to said equalizer, and means connecting said second directional coupler to said second output terminal.

9. The improvement set forth in claim 8 wherein said amplifying means includes a splitter connected to said second directional coupler and includes a plurality of house taps connected to said splitter for receiving signals from said splitter for delivery to house drop cables.

10. In a CATV system having cables with amplifying means spaced along said cables at predetermined unit intervals or fractions thereof to compensate for the attenuation of the signals being carried by said cables, said system having a predetermined main trunk cable signal level and a predetermined distribution or feeder cable signal level, the improvement comprising:
    a. amplifying means for receiving said signals as input signals and having a first and a second output terminal
    b. said amplifying means including means for amplifying said input signals to a first level equal to the input signal levels plus the attenuation of said signals incurred by said signals while traveling said unit interval; said first level equal to said main trunk cable signal level;
    c. means connecting signals amplified to said first level to said first output terminal;
    d. each of said amplifying means also including means for increasing the level of an input signal to produce a second output signal having a level that, when applied to the input of an identical amplifying means, produces a first output signal level of said identical amplifying means equal to said feeder cable signal level.

11. The improvement set forth in claim 10 wherein said means for amplifying said input signals to a first level comprises: a coupling circuit connected to said first output terminal; an amplifier having a tilted output; and means connecting said tilted output to said coupling circuit.

12. The improvement set forth in claim 10 wherein said means for amplifying said input signals to a first level comprises: a directional coupler connected to said first output terminal; an amplifier having a tilted output; and means connecting said tilted output to said directional coupler.

13. In a CATV system having cables for the distribution of CATV signals and having predetermined main trunk signal levels and predetermined distribution or feeder cable levels, the improvement comprising:
    a. a plurality of amplifying means positioned along said cables for amplifying said CATV signals, each of said amplifying means having an input terminal to receive said CATV signals and including means for increasing the level of received signals an amount equal to the attenuation of said signals, incurred by said signals while traveling from a preceding amplifying means over said cable, to produce a first output signal having said predetermined main trunk signal level;
    b. each of said amplifying means also including means for increasing the level of an input signal to produce a second output signal having a level that, when connected to the input of an identical amplifying means, produces a first output signal level of said identical amplifying means equal to said feeder cable signal level.

14. The improvement set forth in claim 13 wherein said means for increasing the level of received signals comprises: an amplifier connected to said input terminal having a tilted output; a directional coupler; and means connecting said tilted output to said directional coupler.

15. The improvement set forth in claim 14 wherein said means for increasing the level of an input signal to produce a second output signal includes an equalizer connected to said directional coupler for imposing a predetermined loss on signals from said directional coupler, said predetermined loss being greater per higher frequencies than for lower frequencies.

amplifier of FIG. 3 is therefore identical to that of FIG. 2; however, it can be seen that the position of the amplifier 32 in the distribution system shown in FIG. 1 results in different signal levels appearing at the respective terminals or taps thereof. The input signal applied to the input terminal 65 is flat; that is, the levels of both the high frequencies or channel 13 and the low frequencies or channel 2 are identical (21 dBmV). The amplification of the amplifier 32 remains the same such that the signals provided at output terminal 68 are 22 dB above the input for channel 13 and 11 dB above the input for channel 2. It will be recalled from the previous discussion that it can be shown the ideal feeder signal level for the highest frequency is 43 dB. Therefore, the amplifier 32, while being identical in construction to the amplifier 16, provides the ability to generate the appropriate signal levels for a feeder cable when the input thereof is connected to the second output of the adjacent and identical amplifier 16.

The second terminal 72 of the amplifier 32, when used as a bridger amplifier provides signal levels that would normally occur at the first output of the amplifier if the amplifier were to be used simply as a main amplifier connected to the trunk line. Therefore, the terminal 72 may be connected to a supplemental or auxiliary trunk line with the next amplifier to be spaced the conventional 22 dB from the amplifier 32. The house taps 78 through 81 may be connected to house drop cables 85 through 88 respectively; the signals available at the taps 78 through 81 (12 dB for channel 13 and 7 dB for channel 2) is appropriate for application to the house drop cables to compensate for the attenuation in the respective frequencies during the travel of the signal from the amplifier 32 to the respective subscriber television sets.

Referring now to FIG. 4, a more detailed diagram of the amplifying system shown in FIG. 2 and 3 may be given. The amplifier portion 100 corresponds to the amplifier portions 45 and 66 in FIGS. 2 and 3 respectively. This amplifier portion 100 receives input signals from the input terminal 42 or 65 of FIGS. 2 and 3 and amplifies these signals so that the highest frequency, channel 13, is brought to a level 22 dB above the input while the lowest frequency, channel 2, is brought to a level 11 dB above the input. The amplifier portion 100 is connected through capacitor 101 to a directional coupler 103. A test point 102 provides a convenient point at which the amplifying system may be checked for proper functioning. The directional coupler 103 couples the output of the amplifier 100 to the first or main output terminal 104; the signal at the terminal 104 is the amplified signal provided at the output to amplifier portion 100 less a a 1.5 dB insertion loss. Therefore, assuming the amplifying system of FIG. 4 is to be utilized in a manner similar to the amplifying system 16 of FIG. 2, (i.e. as a main trunk amplifier) the signal level at the output of amplifier portion 100 will be at 33.5 dB for channel 13 and 28 dB for channel 2. With the insertion loss of the directional coupler 103, the signal available at output 104 will thus be 32 dB for channel 13 and 26.5 dB for channel 2.

The amplifier portion 100 (or 45 in FIG. 2, or 66 in FIG. 3) may be any of several amplifier circuits available to those skilled in the art. Such typical CATV amplifiers having 22 dB to 25 dB include, for example, Anaconda Electronics amplifier Model 8840. The signal levels available from the directional coupler 103, as an input to the equalizer 105, will be the same levels available at the input of the directional coupler less the 6 dB tap loss. Therefore, the signal levels at point 106 of the equalizer 105 will range from 27.5 dB for the channel 13 to 22 dB for the channel 2. The function of the equalizer 105 is to bring the levels of the signals at the opposite ends of the frequency spectrum closer together; the loss at 211 megahertz (channel 13) is 6 dB while the loss at 55 megahertz (channel 2) is 0.5 dB. Therefore, when the signal levels are as above stated at point 106 in the equalizer 105, the signals available at point 107 in the equalizer will be 21.5 dB for all frequencies (or, the output will be "flat"). This flat output is applied to the second directional coupler 109 which imposes a flat 0.5 dB insertion loss to the signals applied thereto and transmitted to the second output terminal 110. The signals at 110 will therefore be flat and at a level of 21 dBmV. The directional coupler 109 includes a 14 dB tap loss for the signal existing at point 112 which signal is then applied to the 4-way splitter 120. The signal thus applied to the 4-way splitter 120 will be 7.5 dBmV for channel 13 and channel 2.

It will be remembered that the values of the signal levels given in connection with FIG. 4 are those signal levels experienced by the amplifying system when the amplifier is used as a main trunk amplifier. The 4-way splitter 120 produces losses ranging from 6.5 dB at the channel 13 frequency down to a 6 dB loss at the channel 2 frequency; however, the signal levels described in connection with FIG. 4 are not suitable when the amplifying system is to be utilized as a bridger or feeder amplifier. The signal levels for the amplifying system when placed in a bridger or feeder environment may be determined in like manner by reference to FIG. 3 and using the signal levels shown at the input to the amplifier when used as a bridger or distribution amplifier and subtracting the various insertion and tap losses as the signals traverse the amplifying system to the house drop outputs of the 4-way splitter 120.

The circuits shown in FIG. 4 for the directional couplers, the equalizer, and the 4-way splitter, are relatively conventional circuitry which may be replaced with other circuitry readily designed by those skilled in the art so long as the functions of coupling, equalizing, and splitting are accompanied with the appropriate losses to provide the above described signal levels.

It may, therefore, be seen that the CATV distribution system of the present invention incorporates amplifying systems which are universal and may be utilized as main amplifiers, bridger amplifiers, distribution amplifiers, splitter amplifiers and the like. In each of these environments, the structure of the amplifying system remains the same with the appropriate signal levels being generated to provide optimum reception at the individual subscriber television sets. The distribution system contemplates the spacing of the amplifier systems at predetermined unit intervals definable in terms of coaxial cable dB signal level loss. These signal levels are maintained at the proper levels for the respective channel frequencies and are at the optimum levels for feeder cables as well as for transmission on main trunk lines and for house drop cables. This optimization of frequency dependent levels is achieved through the utilization of the universal amplifying system that is utilized to replace the numerous and non-interchangeable amplifiers of the prior art to thereby result in significant cost advantages through mass production techniques.

I claim:

16. The improvement set forth in claim 15 including a second directional coupler connected to the flat output of said equalizer and having an output terminal for connection to said cables, or to an input terminal off an identical amplifying means.

17. The improvement set forth in claim 16 wherein each of said amplifying means includes a splitter connected to said second directional coupler and includes a plurality of house taps connected to said splitter for receiving signals from said splitter for delivery to house drop cables.

* * * * *